United States Patent
Abdulai et al.

(10) Patent No.: US 11,671,144 B2
(45) Date of Patent: Jun. 6, 2023

(54) NEAR-FIELD TEST APPARATUS FOR FAR-FIELD ANTENNA PROPERTIES

(71) Applicant: Intel Corporation, Santa Clara, CA (US)

(72) Inventors: Mustapha Amadu Abdulai, Hillsboro, OR (US); Kevin B. Redmond, Beaverton, OR (US); Ronald M. Kirby, Portland, OR (US); Tae Young Yang, Hillsboro, OR (US); Arnaud Amadjikpe, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 16/367,743

(22) Filed: Mar. 28, 2019

(65) Prior Publication Data
US 2020/0313725 A1    Oct. 1, 2020

(51) Int. Cl.
*H04B 5/00* (2006.01)
*G01R 29/08* (2006.01)
*G01R 29/10* (2006.01)
*H04B 17/10* (2015.01)

(52) U.S. Cl.
CPC ....... *H04B 5/0031* (2013.01); *G01R 29/0878* (2013.01); *G01R 29/105* (2013.01); *H04B 17/101* (2015.01)

(58) Field of Classification Search
CPC .............. H04B 5/0031; H04B 17/101; H04B 17/0085; H04B 17/21; G01R 29/0878; G01R 29/105
See application file for complete search history.

(56) References Cited

U.S. PATENT DOCUMENTS

| | | | |
|---|---|---|---|
| 9,880,210 B2 | 1/2018 | Patton | |
| 2015/0177277 A1* | 6/2015 | Nickel | G01R 31/2822 324/629 |
| 2018/0048399 A1* | 2/2018 | Thiruvarankan | H04B 17/101 |
| 2018/0109335 A1 | 4/2018 | Rowell et al. | |
| 2018/0364279 A1 | 12/2018 | Barga et al. | |
| 2019/0356397 A1* | 11/2019 | DaSilva | G01R 31/2856 |

FOREIGN PATENT DOCUMENTS

WO    WO-2021037363 A1 *    3/2021    ......... G01R 31/3025

* cited by examiner

*Primary Examiner* — Zhitong Chen
(74) *Attorney, Agent, or Firm* — Akona IP PC

(57) ABSTRACT

Devices and methods for testing microelectronic assemblies including wireless communications are disclosed herein. For example, in some embodiments, a wireless testing system may include a radio frequency (RF) shielded chamber; a device under test (DUT) in the RF shielded chamber, wherein the DUT includes an array of first antenna elements; a testing apparatus in the RF shielded chamber including an array of second antenna elements at a first surface of a substrate to receive a test signal from the DUT, wherein a distance between individual second antenna elements and an adjacent second antenna element is at least half of a wavelength of the test signal, and wherein a distance between the first antenna elements and the second antenna elements is within a near-field region; and an array of electrical switches, wherein an individual electrical switch is coupled to a respective individual second antenna element.

20 Claims, 8 Drawing Sheets

NEAR-FIELD TEST APPARATUS FOR FAR-FIELD ANTENNA PROPERTIES

BACKGROUND

Some integrated circuit (IC) devices may include wireless or radio frequency (RF) components, such as antennas, to provide wireless connectivity and communications between IC devices in a wireless network, These components used for wireless communication may be verified by testing apparatuses and methods.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
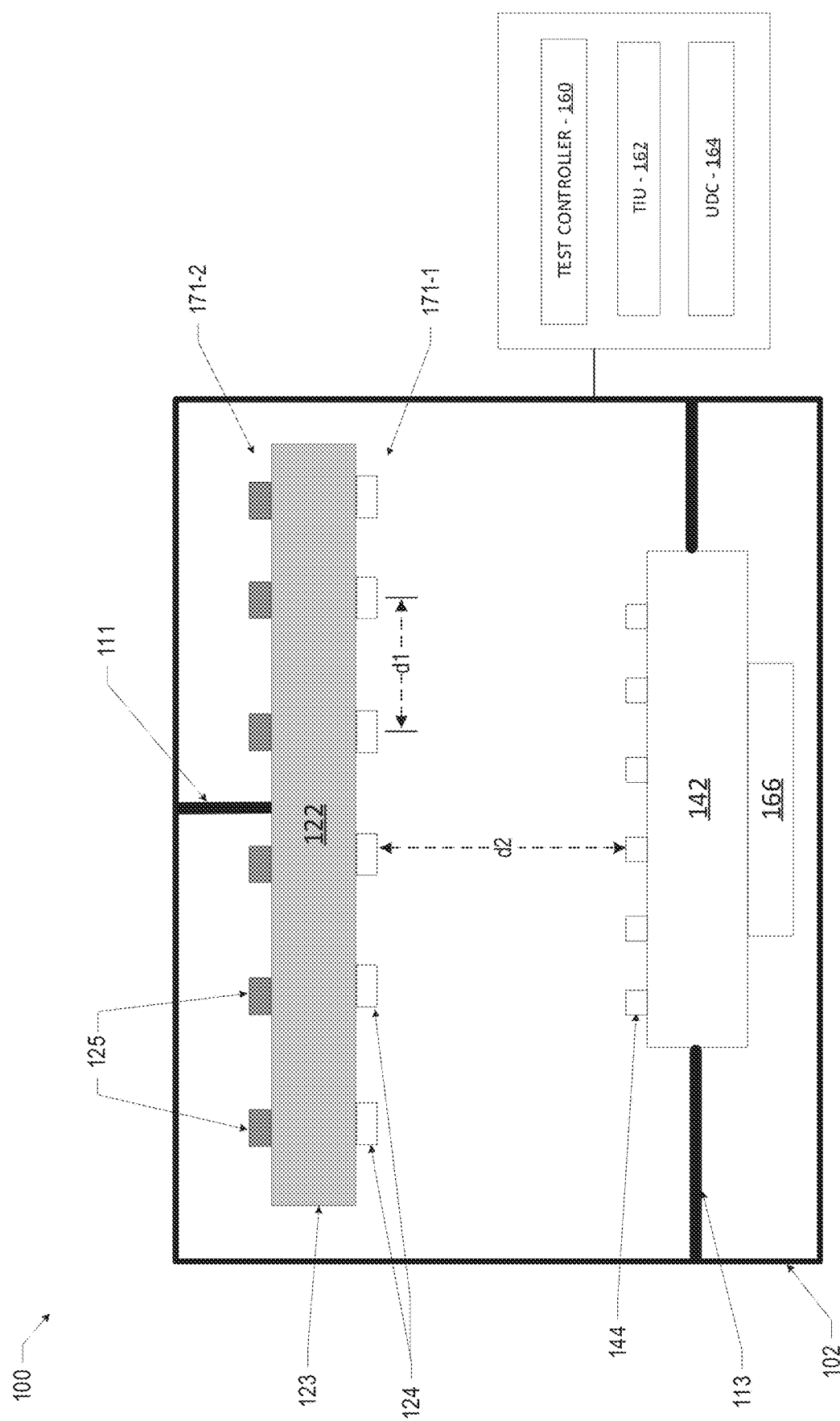
FIG. 1 is a side transparent view of a microelectronic testing system including an example test apparatus, in accordance with various embodiments.

Devices and methods for testing Microelectronic assemblies including wireless communications are disclosed herein. For example, in some embodiments, a wireless testing apparatus may include an array of antenna elements at a first surface of a substrate to receive a test signal from a device under test (DUT), and an array of electrical switches coupled to a respective antenna element, wherein a distance between individual antenna elements and an adjacent antenna element is at least half of a wavelength of the test signal, and wherein a distance between the antenna elements and the DUT is within a near-field region.

Some microelectronic assemblies having wireless communications may be tested for functionality and/or performance prior to product distribution. Conventional testing systems may include an RF shielded chamber, where a wireless microelectronic assembly and a test device or controller may be placed to capture a full three-dimensional (3D) electromagnetic field and extract various electromagnetic field properties. Scanning a full 3D electromagnetic field that includes far-field properties using conventional testing systems may require a very large chamber, mechanically rotating the DUT, and may take hours or days to complete. Further, typically, only a single antenna array on a DUT can be tested at a time. A testing system for verifying wireless communication of a microelectronic assembly that can be performed on a small scale, within a near-field of the electromagnetic field, and within a short period of time may be desired. Further, a testing system that may test multiple antenna arrays on a single DUT or multiple DUTs simultaneously may be preferred.

Various ones of the embodiments disclosed herein may help achieve more efficient wireless testing results relative to conventional approaches. The testing apparatuses and methods disclosed herein may be particularly advantageous for testing small and low-profile applications in computers, tablets, industrial robots, and consumer electronics (e.g., wearable devices) that include wireless communications.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified. As used herein, the terms "face" and "surface" may be used interchangeably.

When used to describe a range of dimensions, the phrase "between X and Y" represents a range that includes X and Y. For convenience, the phrase "FIG. 2" may be used to refer to the collection of drawings of FIGS. 2A-2B, the phrase "FIG. 4" may be used to refer to the collection of drawings of FIGS. 4A-4B, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a microelectronic testing system 100, in accordance with various embodiments. The microelectronic testing system 100 may include an RF shielded chamber 102, which is depicted from a front side view as transparent in FIG. 1, with a wireless test apparatus 122 and a DUT 142 therein. The DUT 142 may include a plurality of antennas 144 for transmitting and/or receiving RF signals, and may include circuitry for providing power and for activating and deactivating the plurality of antennas 144. The test apparatus 122 may include a substrate 123 having a plurality of antenna elements 124 at a first surface 171-1 and a plurality of electrical switches 125 at an opposing second surface 171-2. The plurality of antenna elements 124 may be arranged in an array, and an individual antenna element 124 may be spaced apart from an adjacent individual antenna element 124 by a distance d1 (i.e., as measured from center point to center point, and also may be referred to herein as pitch), where d1 is at least half of a wavelength of a test signal. For example, in some embodiments, d1 is between 3 millimeters and 60 millimeters. In some embodiments, d1 is between 5 millimeters and 20 millimeters. The pitch of the antenna elements and the size of individual antenna elements may be selected to be optimal for capturing the electromagnetic field data in the test frequency and/or test frequency range. The plurality of antenna elements 124 on the test apparatus 122 may be configured to transmit and/or receive RF signals, and may include circuitry for providing power and for activating and deactivating the plurality of antenna elements 124. In particular, the plurality of antenna elements 124 on the test apparatus 122 may be configured to receive RF signals transmitted by the plurality of antennas 144 on the DUT 142. In some embodiments, the test apparatus 122 and the DUT 142 have the same number of antenna elements. In some embodiments, the test apparatus 122 and the DUT 142 have different numbers of antenna elements (e.g., the test apparatus 122 may have more antenna elements or may have less antenna elements than the DUT 142). The medium between the test apparatus 122 and the DUT 142 may be any suitable medium. In some embodiments, the RF signals may be transmitted over the air (OTA). In some embodiments, the RF signals may be transmitted through a low dielectric material. The plurality of electrical switches 125 may be arranged to have an individual electrical switch 125 be aligned or associated with a respective individual antenna element 124. An individual electrical switch 125 may be electrically coupled to an individual antenna element 124, such that an individual antenna element 124 may be activated or deactivated (e.g., turned on or off) via a respective individual electrical switch 125. The electrical switches 125 may allow for capturing electromagnetic field properties of the DUT 142 at each individual antenna element 124 and for one or more antenna elements 124 simultaneously without mechanically rotating or moving the DUT 142 or the test apparatus 122. In some embodiments, the electrical switches 125 enable scanning of the individual antenna elements 124, where the individual antenna elements 124 are activated successively to capture RF signal data from the DUI 142. Although FIG. 1 illustrates the electrical switches 125 at an opposing second surface 171-2 from the plurality of antenna elements 124, the electrical switches 125 may be at any suitable. surface. For example, the electrical switches 125 may be at a same surface as the plurality of antenna elements 124 (e.g., at the first surface 171-1), may be at more than one surface (e.g., at the first and second surfaces 171-1, 171-2), or may be on another component or substrate that may be coupled to the plurality of antenna elements 124. In some embodiments, the electrical switches 125 may be embedded in a substrate (e.g., embedded in the substrate 123). In some embodiments, a plurality of optical electromagnetic sensing devices may be used in place of the plurality of antenna elements.

The antennas 144 on the DUT 142 may be positioned at a distance d2 from the antenna elements 124 on the wireless test apparatus 122, where d2 is within a near-field region. As used herein, a near-field region has a minimum distance equal to $0.62*(D3/lambda)^{1/2}$ and a maximum distance equal to $2*D2/lambda$, wherein D is a diameter of an antenna array on the DUT and lambda is a wavelength of the test signal. For example, a near-field distance for a test system including a DUT having an antenna array diameter of 10 millimeters and a test signal frequency of 28 GHz may range between 6.0 millimeters and 18.7 millimeters (e.g., $d2(min)=(0.62*(103/10.7)^{1/2})$ and $d2(max)=(2*102/10.7)$). Table 1 includes example calculations of d1 and d2 for various antenna element diameters (e.g., various DUT sizes) and various test signal frequencies, which may be used to calculate lambda (e.g., wavelength). As described above with reference to FIG. 1, d1 equals lambda/2, and d2 is within a near-field having a minimum distance of $(0.62*(D3/lambda)^{1/2})$ and a maximum distance of $(2*D2/lambda)$.

TABLE 1

| Frequency (GHz) | Lambda (mm) | D (mm) | d1 (mm) | d2 (mm) |
|---|---|---|---|---|
| 28 | 10.7 | 10 | 5.4 | 6.0-18.7 |
| 60 | 5.0 | 10 | 2.5 | 8.8-40.0 |
| 90 | 3.3 | 10 | 1.7 | 10.7-60.0 |
| 110 | 2.7 | 10 | 1.4 | 11.9-73.3 |
| 28 | 10.7 | 25 | 5.4 | 23.7-116.7 |
| 60 | 5.0 | 25 | 2.5 | 34.7-250.0 |
| 90 | 3.3 | 25 | 1.7 | 42.4-375.0 |
| 110 | 2.7 | 25 | 1.4 | 46.9-458.3 |
| 28 | 10.7 | 50 | 5.4 | 67.0-466.7 |
| 60 | 5.0 | 50 | 2.5 | 98.0-1000.0 |
| 90 | 3.3 | 50 | 1.7 | 120.1-1500.0 |
| 110 | 2.7 | 50 | 1.4 | 132.7-1833.3 |
| 1 | 300.0 | 50 | 150 | 12.7-16.7 |

In some embodiments, d2 is between 5 millimeters and 250 millimeters. In some embodiments, d2 is between 250 millimeters and 500 millimeters. In some embodiments, d2 is between 500 millimeters and 1000 millimeters. In some embodiments, d2 is between 1000 millimeters and 2000 millimeters.

The substrate 123 may include any suitable substrate, for example, a circuit board, an interposer, a die, or a package substrate, and may include any suitable material, for example, ceramic, silicon, or dielectric. In some embodiments, the substrate 123 may include conductive pathways to route power, ground, and/or signals, or to electrically couple different components (e.g., electrically couple the antenna elements 124 to the electrical switches 125). In some embodiments, the substrate 123 may be a circuit board, for example, a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board. In other embodiments, the circuit board may be a non-PCB substrate. In some embodiments, the substrate 123 may be a package substrate including an insulating material (e.g., a dielectric material formed in multiple layers, as known in the art) and one or more conductive pathways through the dielectric material (e.g., including conductive traces and/or conductive vias). A dielectric layer may include a single layer or may include multiple layers. In some embodiments, the insulating material of the package substrate may be a dielectric material, such as an organic dielectric material, a fire retardant grade 4 material (FR-4), BT resin, polyamide materials, glass reinforced epoxy matrix materials, or low-k and ultra low-k dielectric (e.g., carbon-doped dielectrics, fluorine-doped dielectrics, porous dielectrics, and organic polymeric dielectrics). In some embodiments, the conductive pathways in the package substrate may be bordered by liner materials, such as adhesion liners and/or barrier liners, as suitable. In some embodiments, the package substrate is coreless. In some embodiments, the package substrate may include a core or carrier. In some embodiments, the substrate 123 may be an interposer formed of an epoxy resin, a fiberglass-reinforced epoxy resin, an epoxy resin with inorganic fillers, a ceramic material, or a polymer material such as polyamide. In some embodiments, the interposer may be formed of alternate rigid or flexible materials that may include the same materials described above for use in a semiconductor substrate, such as silicon, germanium, and other group III-V and group IV materials. The interposer may include metal interconnects and vias, including but not limited to through silicon vias (TSVs).

The RF shielded chamber 102 may include a structure having an outer shielded frame and an interior space for placing a test apparatus 122 and a DUT 142. The outer shielded frame may be designed to reduce outside RF electromagnetic fields from reaching the interior space (e.g., the size, shape, thickness, and material composition of the outer shielded frame). For example, the outer shielded frame may include copper for RF shielding. The RF shielded chamber 102 may include a mechanism for accessing the interior space, such as a hinged door. The wireless test apparatus 122 and the DUT 142 may be supported or mounted within the RF shielded chamber using any suitable support structure 111, 113; for example, the support structure 111 may include an arm and/or the support structure 113 may include a frame. In some embodiments, the support structures 111, 113 may include a damp, a socket, or other mechanical structure for attaching the wireless test apparatus 122 and/or DUT 142. In some embodiments, the support structures 111, 113 may be stationary and may not rotate. In some embodiments, the support structure 111, 113 may be movable, adjustable, and/or removable. In some embodiments, the plurality of antennas 144 on the DUT 142 may be combined or pointed in a specific direction to steer the RF signal, and a steering angle may be measured to determine the accuracy without moving the DUT 142 and/or the test apparatus 122.

The test apparatus 122 may be coupled to a processor and a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.) for storing and/or analyzing test data received from the DUT 142. During testing, individual antenna elements 124 on the test apparatus 122 may receive RF signals from the DUT 142 and may store the received RF signal data in memory. The RF signal data from the DUT 142 captured by the plurality of antenna elements 124 may include, for example, signal power, phase, frequency, and/or polarization. The processor may determine the 3D electromagnetic field of the DUT 142 by transferring the received near-field RF signal data to far-field data using known methods, such as Fast Fournier Transform (FFT) or spherical wave expansion methods. The far-field data may be compared to target data to determine whether the wireless communications of the DUT 142 pass or fail the functionality and/or performance testing. In some embodiments, the target data may be defined by product specifications. In some embodiments, the target data may be defined by conventional far-field testing results.

The DUT 142 may be any suitable device for receiving and/or transmitting RF signals, such as a mobile electrical device, a server device, a wireless router, or a wearable computing device, among others, as described below with reference to FIG. 7. In some embodiments, the DUT 142 may include a processor, a wireless IC die, and an antenna array.

The microelectronic testing system 100 may be designed based on a test signal frequency, the microelectronic testing system 100 is scalable and may be designed based on a suitable test frequency. In some embodiments, a microelectronic testing system 100 may be designed based on a frequency of a RF test signal transmitted by a DUT 142. For example, the test frequency may be between 1 GHz and 110 GHz and the microelectronic testing system 100 may be designed for a test frequency of 1 GHz, a test frequency of 110 GHz, or any test signal frequency in between these values. In some embodiments, a microelectronic testing system 100 may be designed based on a test signal frequency of 6 GHz, 20 GHz, 28 GHz, 60 GHz, or 90 GHz (e.g., based on 5G specification frequency bands).

In some embodiments, a microelectronic testing system 100 may be designed based on a maximum frequency of an RF test signal, and a DUT 142 transmitting a lower-frequency RF test signal may be tested based on distances d1 and d2 determined by the maximum frequency and the diameter of the DUT antenna array. In particular, the microelectronic testing system 100 may be designed based on a maximum test signal frequency, where the test results are within acceptable error tolerance levels. For example, a microelectronic testing system 100 designed based on a maximum test signal frequency of 28 GHz may be used to test a DUT 142 that transmits at a frequency of 20 GHz. In another example, a microelectronic testing system 100 designed based on a maximum test signal frequency of 2A GHz may be used to test a DUT 142 that transmits at a frequency of 1 GHz.

A microelectronic testing system 100 may further include a test controller 160, a test interface unit (TIU) 162, and/or an up/down converter (UDC) 164 for the DUT 142. A test controller 160 may perform any appropriate sequence of transmitting and receiving of RF test signals to evaluate the DUT 142. A test controller 160 may perform testing on the DUT 142 and may store test results for the DUT 142 in memory. In some embodiments, a test controller 160 may be implemented as executable instructions stored in memory and loaded into RAM for execution by a processor. A TIU 162 may include circuitry to provide power and to energize the antennas 144 on the DUT 142 to transmit RF signals to the test apparatus 122. An UDC 164 may convert a signal from a higher frequency to a lower frequency or may convert a signal from a lower frequency to a higher frequency. In some embodiments, the test controller 160 may interface with the TIU. A test controller 160 may execute a test script that is specific to the DUT 142; for example, the test controller 160 may receive information, e.g. a model number or serial number, from the DUT 142 by a wireless communications channel, and may execute an appropriate test script for the DUT 142 based on the received information.

In some embodiments, the test controller 160 may process and store any appropriate information for the test result. For example, the test controller 160 may store data from the received signal, may convert the received near-field test signal to far-field data, and may compare the far-field data to target data. In some embodiments, the test controller 160 may control the electrical switches 125 to sequence or scan through the plurality of antenna elements 124. In some embodiments, the test controller 160 may scan through the plurality of antenna elements 124 one time. In some embodiments, the test controller 160 may scan through the plurality of antenna elements 124 multiple times. The test controller 160 may store a "pass" or "fail" for the DUT 142 depending on whether the converted data from the received signal sufficiently matches the target data, along with a device identifier for the DUT 142. In another example, the test controller 160 may store data characterizing the waveform of the received signal. The test controller 160 may send the stored test results to another computer system or display test results on a display.

A microelectronic testing system 100 may further include a thermal solution 166 for the DUT 142. A thermal solution 166 may be included to maintain an operating temperature of a DUT 142 (e.g., to cool the DUT 142 to be within an acceptable temperature range). The thermal solution 166 may include, for example, a heat spreader or a cooling plate.

The antennas 144 and the antenna elements 124 may include any suitable antenna structures. For example, an antenna may include a single-layer antenna or a multi-layer antenna. The multi-layer antenna may have broader frequency bandwidth relative to a single-layer antenna. The multi-layer antenna may be a surface mount device or may be implemented on one, two, or more layers of the substrate 123. In some embodiments, a multi-layer antenna may include a first layer of antenna elements and a second layer of antenna elements separated by a dielectric layer. In some embodiments, the multi-layer antenna may have the first layer of antenna elements coupled to the second layer of antenna elements via conductive pathways. In some embodiments, the multi-layer antenna may include a capacitively coupled antenna where the first layer of antenna elements is capacitively coupled to the second layer of antenna elements and not galvanically coupled via conductive pathways. When capacitively coupled, signals transmitted from the first layer of antenna elements may excite the second layer of antenna elements into transmission as well. In some embodiments, the capacitively coupled antenna elements may be vertically aligned. In some embodiments, the antennas 144 and the antenna elements 124 may include antennas with resonating elements that are formed from loop antenna structures (e.g., antenna coil structures), inverted-F antenna structures, dosed and open slot antenna structures, planar inverted-F antenna structures, helical antenna structures, strip antennas, monopoles, dipoles, single or dual pole antennas, or any other type of antenna suitable for transmission of RF signals. Different types of antennas may be used for different bands and combinations of bands. For example, one type of antenna may be used in forming a local wireless link antenna and another type of antenna may be used in forming a remote wireless link. In another example, near-field transceiver circuitry and non-near-field transceiver circuitry may be coupled to respective antennas, or a transceiver may be coupled to one or more antennas.

Many of the elements of the microelectronic testing system 100 of FIG. 1 may be included in other ones of the microelectronic testing systems 100 disclosed herein but may not be depicted in the accompanying figures. For example, the support structures 111, 113, test controller 160, TIU 162, UDC 164, and thermal solution 166 may be omitted from the accompanying figures.

Figure 2A:
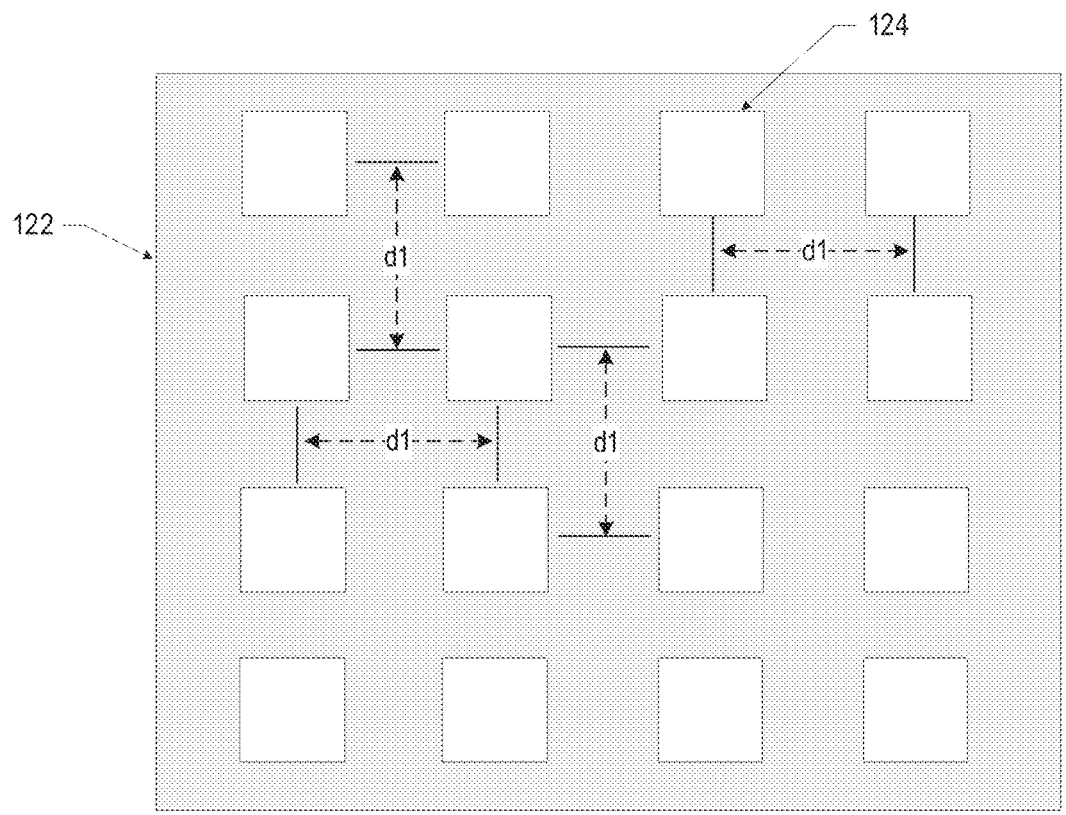
FIGS. 2A and 2B are top and bottom views of an example test apparatus, in accordance with various embodiments.
Figure 2B:
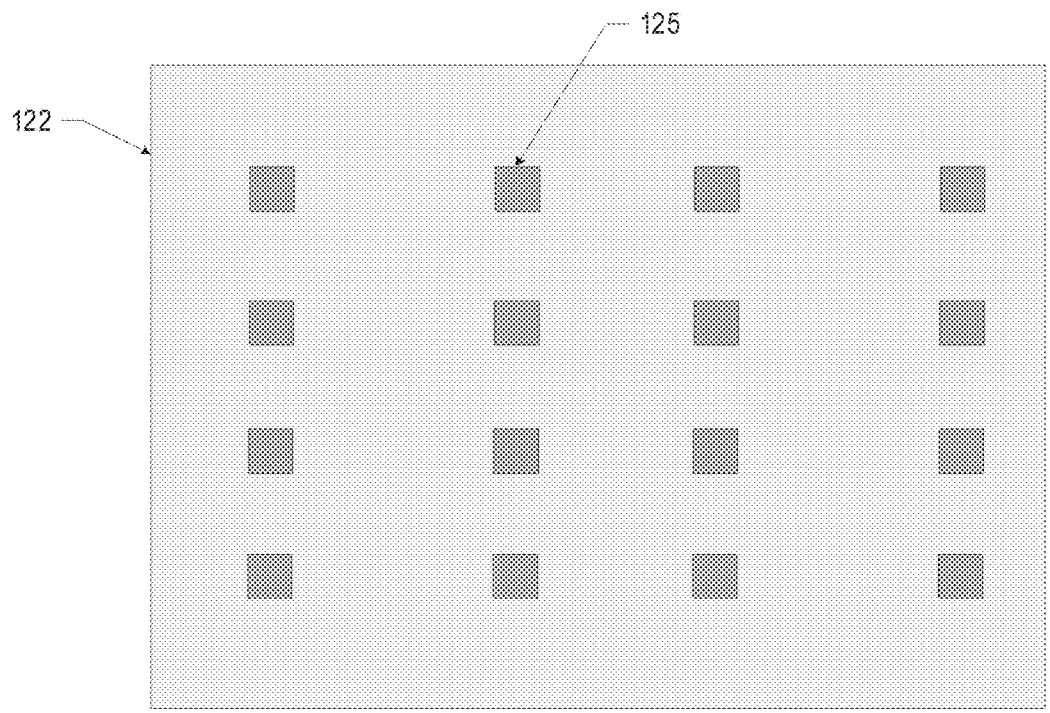

FIGS. 2A and 2B are top and bottom views of the example test apparatus 122 of FIG. 1, in accordance with various embodiments. FIG. 2A is a bottom view of the test apparatus 122 showing a four-by-four array of sixteen antenna elements 124. In particular, an individual antenna element 124 is spaced apart from an adjacent antenna element 124 by a distance d1, where d1 is at least half of a wavelength of a maximum test signal. FIG. 2B is a top view of the test apparatus 122 showing a four-by-four array of sixteen electrical switches 125. Although FIG. 2 shows a particular number and arrangement (e.g., M by N elements) of antenna elements 124, a test apparatus 122 may include any suitable number and arrangement of antenna elements 124, including more than sixteen elements and fewer than sixteen elements. In some embodiments, a testing apparatus 122 may include a nine-by-nine array of eighty-one antenna elements 124 and respective electrical switches 125. In some embodiments, the number of antenna elements 124 on a test apparatus 122 is equal to the number of antenna elements on a DUT. In some embodiments, the number of antenna elements 124 on a test apparatus 122 is different from the number of antenna elements on a DUT.

Figure 3:
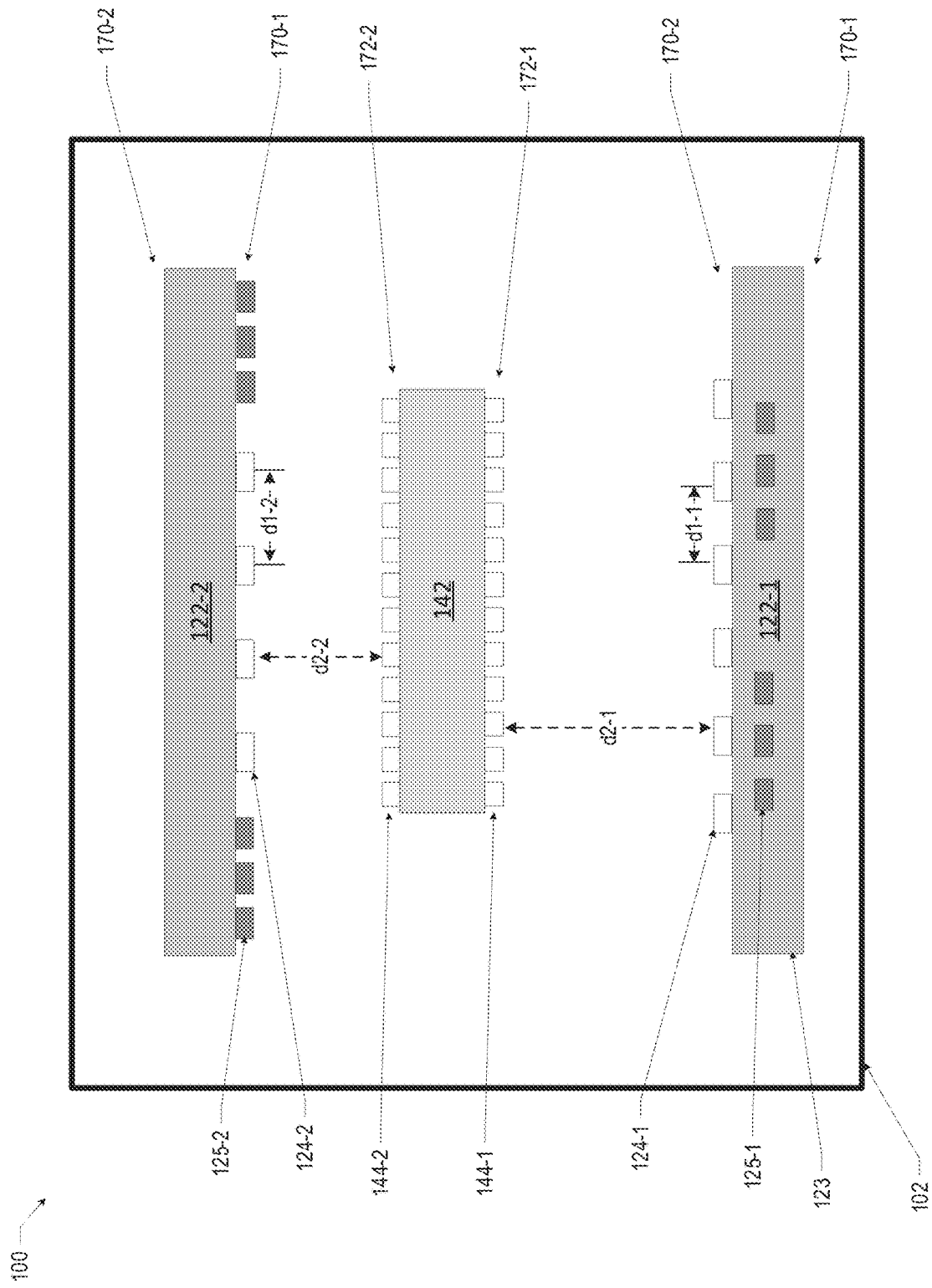
FIG. 3 is a side transparent view of a microelectronic testing system including an example test apparatus, in accordance with various embodiments.

FIG. 3 is a microelectronic testing system 100, in accordance with various embodiments. The microelectronic testing system 100 may include an RF shielded chamber 102, and a first wireless test apparatus 122-1, a second wireless test apparatus 122-2, and a DUT 142, therein. The first and second test apparatuses 122-1, 122-2 may include a first surface 170-1 and an opposing second surface 170-2. The first test apparatus 122-1 may include an array of antenna elements 124-1 spaced apart by a distance d1-1 at the second surface 170-2 coupled to an array of electrical switches 125-1 embedded within the substrate 123 of the first test apparatus 122-1. The second test apparatus 122-2 may include an array of antenna elements 124-2 spaced apart by a distance d1-2 at the first surface 170-1 coupled to an array of electrical switches 125-2 at the first surface 170-1. The DUT 142 may include a first antenna 144-1 at a first surface 172-1 and a second antenna 144-2 at an opposing second surface 172-2. The first and second antennas 144-1, 144-2 may be for transmitting and/or receiving RF signals. The first antenna 144-1 of the DUT 142 may be positioned at a distance d2-1 from the array of antenna elements 124-1 on the first test apparatus 122-1, and the second antenna 144-2 of the DUT 142 may be positioned at a distance d2-2 from the array of antenna elements 124-2 on the second test apparatus 122-2. The distances d1 (i.e., d1-1, d1-2) and d2 (i.e., d2-1, d2-2) may be determined as described above with reference to FIG. 1. In some embodiments, d1-1 is equal to d1-2. In some embodiments, as shown in FIG. 3, d1-1 is different from d1-2. In some embodiments, d2-1 is equal to d2-2. In some embodiments, as shown in FIG. 3, d2-1 is different from d2-2, in some embodiments, the first antenna 144-1 and the second antenna 144-2 of the DUT 142 transmit a same signal frequency. In some embodiments, the first antenna 144-1 and the second antenna 144-2 of the DUT 142 transmit different signal frequencies, For example, the first antenna 144-1 may transmit an RF signal at a frequency of 28 GHz, and the second antenna 144-2 may transmit an RF signal at a frequency of 20 GHz. During operation, the microelectronic testing system 100 may test the first and second antennas 144-1, 144-2 simultaneously, where the first test apparatus 122-1 may receive RF signals from the first antenna 144-1 of the DUT 142 at the same time the second test apparatus 122-2 may receive RF signals from the second antenna 144-2 on the DUT 142.

Figure 4A:
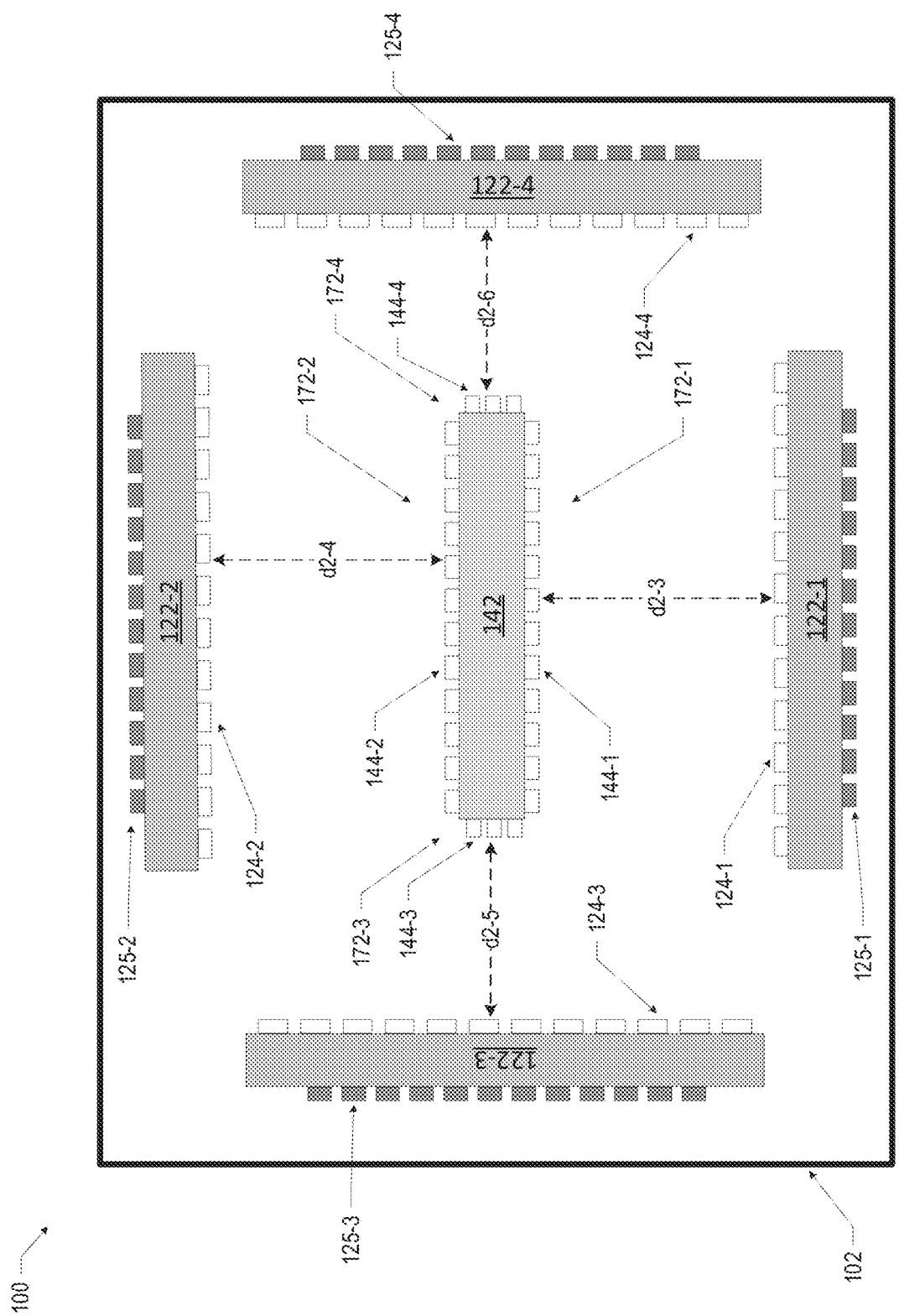
FIGS. 4A and 4B are side transparent views of a microelectronic testing system including an example test apparatus, in accordance with various embodiments.

FIG. 4A is a microelectronic testing system 100, in accordance with various embodiments. The microelectronic testing system 100 may include an RF shielded chamber 102, and a first wireless test apparatus 122-1, a second wireless test apparatus 122-2, a third test apparatus 122-3, a fourth test apparatus 122-4, and a DUT 142, therein. The test apparatuses 122-1, 122-2, 122-3, 122-4 may include an array of antenna elements 124-1, 124-2, 124-3, 124-4 at a surface coupled to an array of electrical switches 125-1, 125-2, 125-3, 125-4 at an opposing surface, respectively. The individual antenna elements may be spaced apart by a distance d1 (not shown), as described above with reference to FIG. 1, and the array of antenna elements 124-1, 124-2, 124-3, 124-4 may have a same pitch or may have a different pitch from one or more of the other antenna arrays. The array of antenna elements 124 may be for receiving and/or transmitting RF signals. The DUT 142 may include a first antenna 144-1 at a first surface 172-1, a second antenna 144-2 at an opposing second surface 172-2 from the first surface 172-1, a third antenna 144-3 at a third surface 172-3, and a fourth antenna 144-4 at an opposing fourth surface 172-4 from the third surface 172-3. The antennas 144-1, 144-2, 144-3, 144-4 may be for transmitting and/or receiving RF signals. The first antenna 144-1 of the DUT 142 may be positioned at a distance d2-3 from the array of antenna elements 124-1 on the first test apparatus 122-1, the second antenna 144-2 of the DUT 142 may be positioned at a distance d2-4 from the array of antenna elements 124-2 on the second test apparatus 122-2, the third antenna 144-3 of the DUT 142 may be positioned at a distance d2-5 from the array of antenna elements 124-3 on the third test apparatus 122-3, and the fourth antenna 144-4 of the DUT 142 may be positioned at a distance d2-6 from the array of antenna elements 124-4 on the fourth test apparatus 122-4. The d2 distances (i.e., d2-3-d2-6) may be determined as described above with reference to FIG. 1. In some embodiments, one or more of d2-3, d2-4, d2-5, and d2-6 are equal. In some embodiments, one or more of d2-3, d2-4, d2-5, and d2-6 are different. In some embodiments, the antennas 144-1, 144-2, 144-3, 144-4 of the DUT 142 have a same signal frequency. In some embodiments, one or more of the antennas 144-1, 144-2, 144-3, 144-4 of the DUT 142 have a different signal frequency. During operation, the microelectronic testing system 100 may test the antennas 144-1, 144-2, 144-3, 144-4 simultaneously.

Figure 4B:
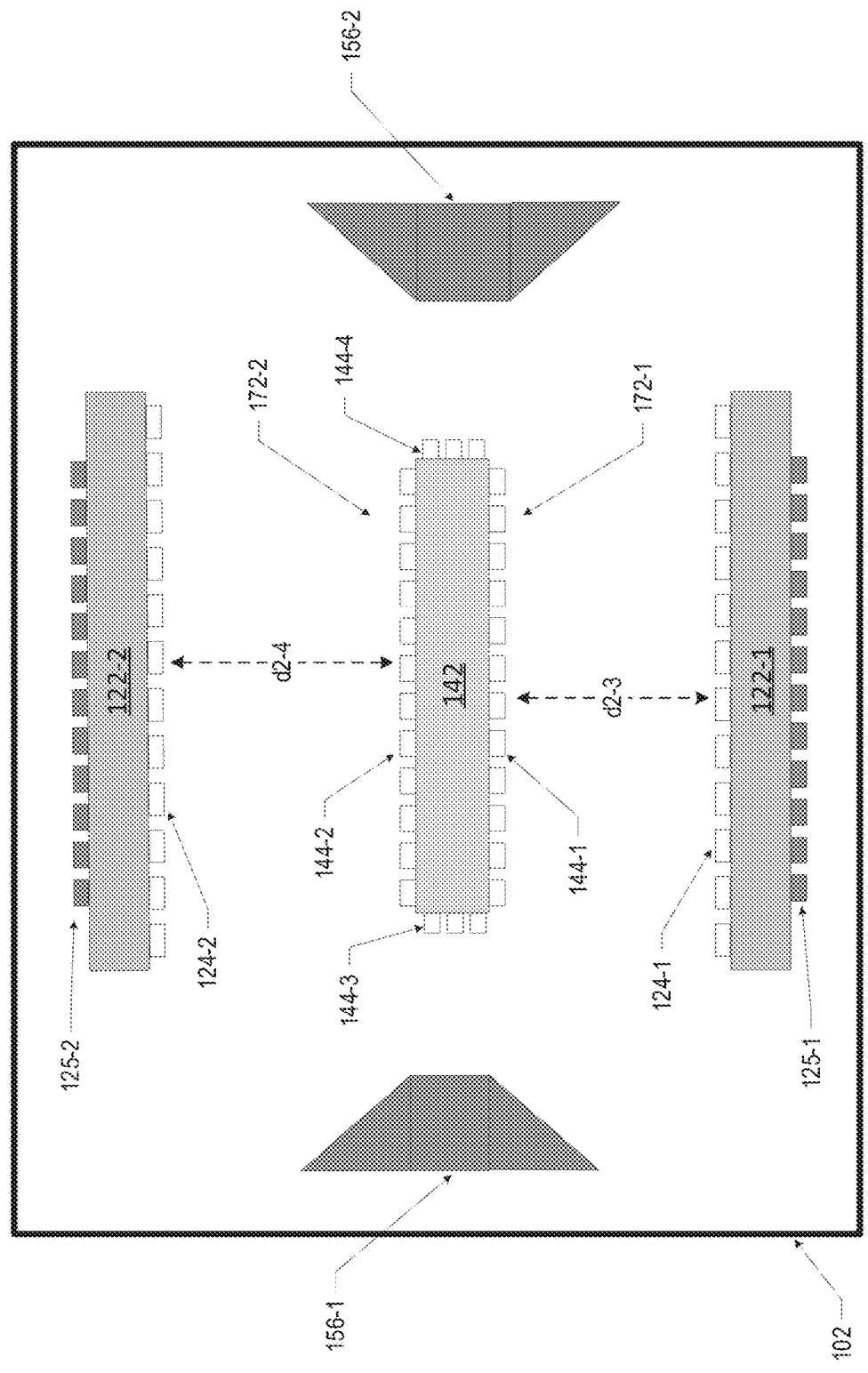

FIG. 4B is the microelectronic testing system 100 of FIG. 4A with the third and fourth test apparatuses 122-3, 122-4 omitted, in accordance with various embodiments. As shown in FIG. 4B, the microelectronic testing system 100 may further include a first reflector 156-1 and a second reflector 156-2 for reflecting RF signals from the third antenna 144-3 and the fourth antenna 144-4, respectively, to the first and/or second test apparatus 122-1, 122-2.

Figure 5:
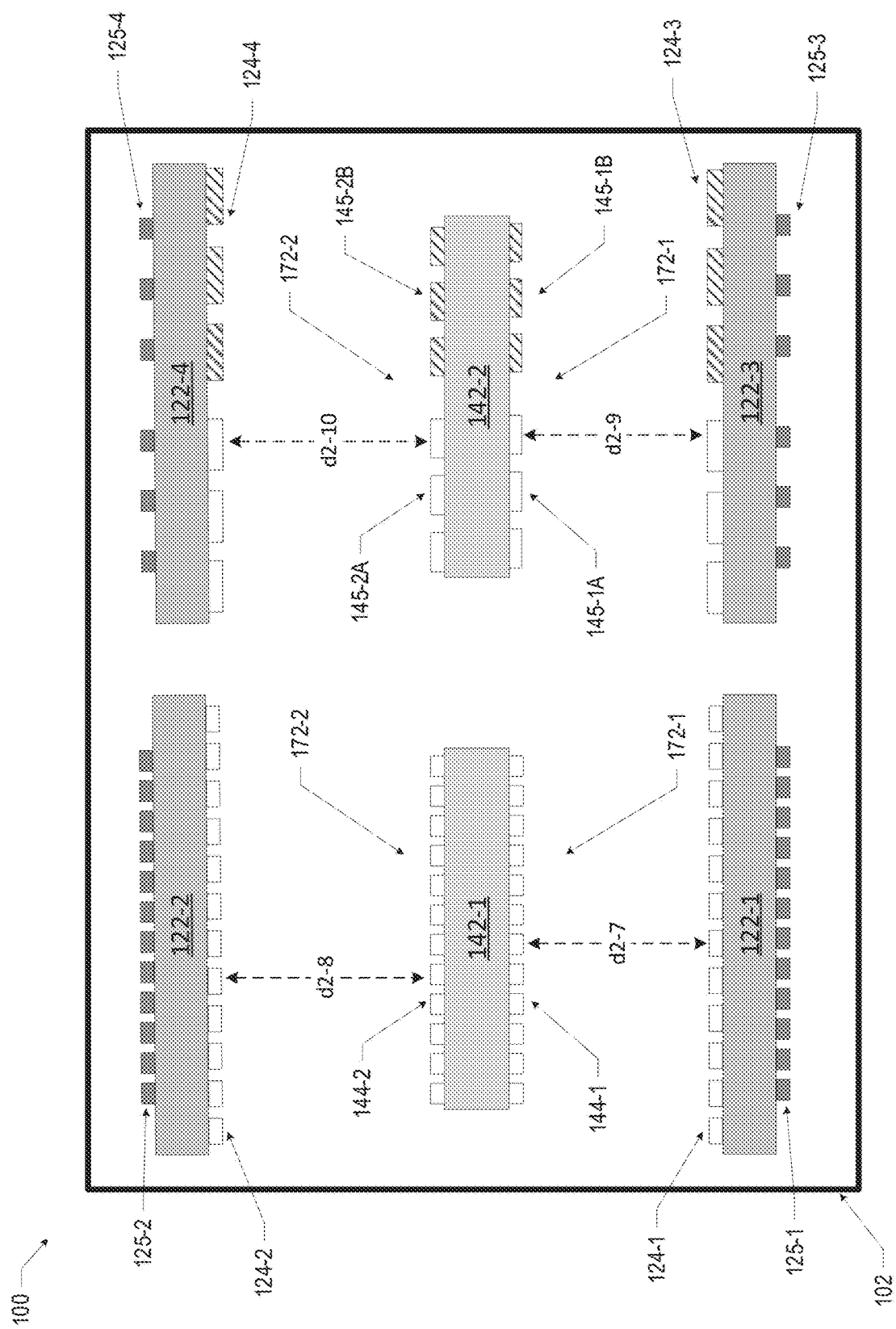
FIG. 5 is a side transparent view of a microelectronic testing system including an example test apparatus, in accordance with various embodiments.

FIG. 5 is a microelectronic testing system 100, in accordance with various embodiments. The microelectronic testing system 100 may include a DUT having a multiband antenna. In particular, the microelectronic testing system 100 may include an RF shielded chamber 102, and a first wireless test apparatus 122-1, a second wireless test apparatus 122-2, a third test apparatus 122-3, a fourth test apparatus 122-4, a first DUT 142-1, and a second DUT 142-2, therein. The test apparatuses 122-1, 122-2, 122-3, 122-4 may include an array of antenna elements 124-1, 124-2, 124-3, 124-4 at a surface coupled to an array of electrical switches 125-1, 125-2, 125-3, 125-4 at an opposing surface, respectively. The individual antenna elements may be spaced apart by a distance d1 (not shown), as described above with reference to FIG. 1, The array of antenna elements 124 may be for receiving and/or transmitting RF signals. The array of antenna elements 124-3 and 124-4 may include multiband antennas having a first portion for receiving and/or transmitting at a first frequency and a second portion for receiving and/or transmitting at a second frequency, where the second frequency is different from the first frequency. The first DUT 142-1 may include a first antenna 144-1 at a first surface 172-1, and a second antenna 144-2 at an opposing second surface 172-2 from the first surface 172-1. The second DUT 142-2 may include a third antenna 145-1 at the first surface 172-1 having a first portion 145-1A active for a first frequency and a second portion 145-1B active for a second frequency, where the first frequency is different from the second frequency. The second DUT 142-2 may further include a fourth antenna 145-2 at the second surface 172-2 having a first portion 145-2A active for a third frequency and a second portion 145-2B active for a fourth frequency, where the third frequency is different from the fourth frequency. The antennas 144, 145 may be for transmitting and/or receiving RF signals. The first antenna 144-1 of the first DUT 142-1 may be positioned at a distance d2-7 from the array of antenna elements 124-1 on the first test apparatus 122-1, and the second antenna 144-2 of the first DUT 142-1 may be positioned at a distance d2-8 from the array of antenna elements 124-2 on the second test apparatus 122-2. The third antenna 145-1 of the second DUT 142-2 may be positioned at a distance d2-9 from the array of antenna elements 124-3 on the third test apparatus 122-3, and the fourth antenna 145-2 of the second DUT 142-2 may be positioned at a distance d2-10 from the array of antenna elements 124-4 on the fourth test apparatus 122-4. The d2 distances (i.e., d2-7—d2-1) may be determined as described above with reference to FIG. 1. In some embodiments, one or more of the distances d2-7, d2-8, d2-9, and d2-10 are equal. In some embodiments, one or more of the distances d2-7, d2-8, d2-9, and d2-10 are different, During operation, the microelectronic testing system 100 may test the antennas 144 and 145 simultaneously.

Figure 6:
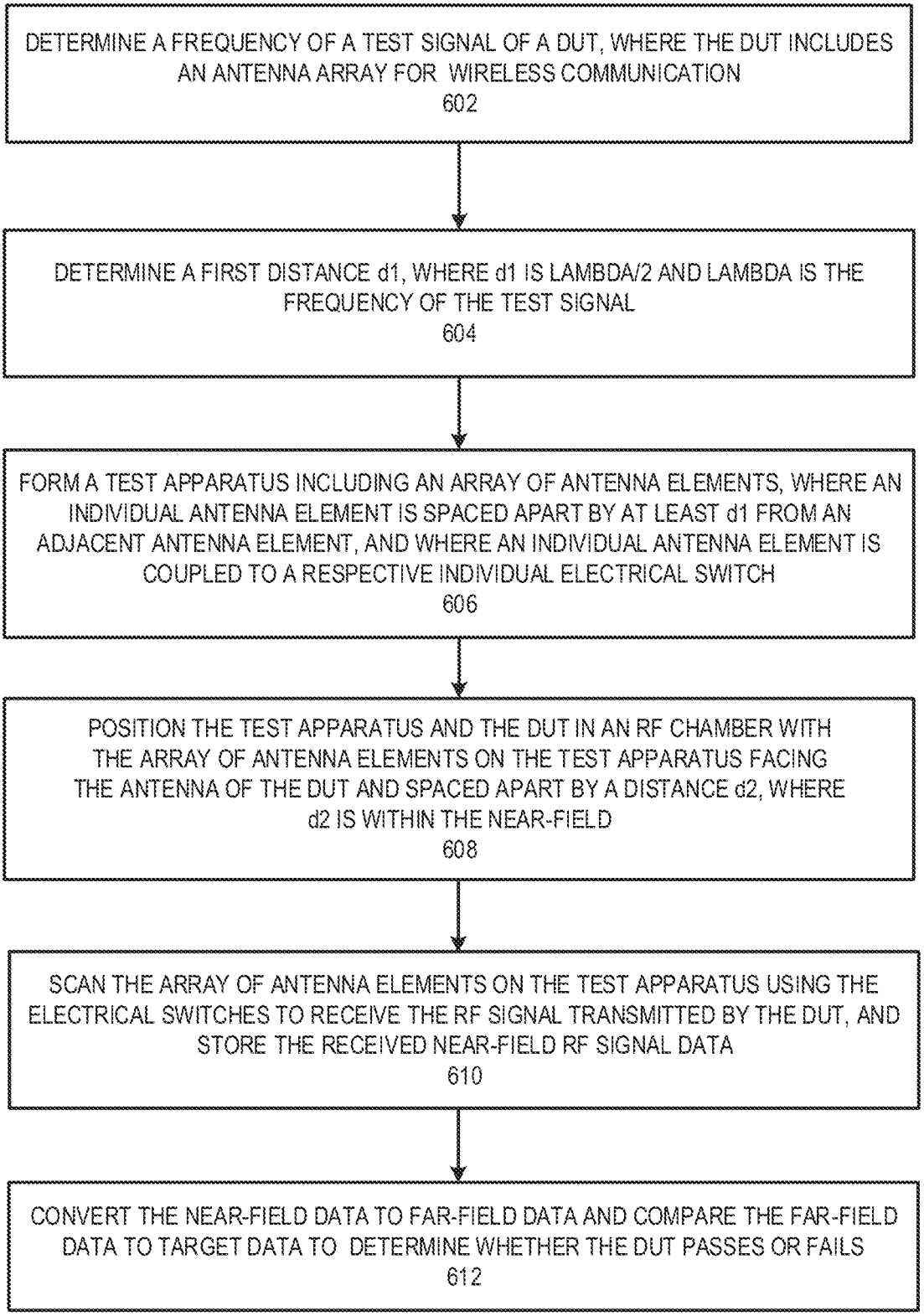
FIG. 6 is a process flow diagram of an example method of testing a microelectronic assembly using an example test apparatus, in accordance with various embodiments.

FIG. 6 is a process flow diagram of an example method of testing a microelectronic assembly using an example test apparatus, in accordance with various embodiments. At 602, determine a frequency of an RF test signal of a DUT having wireless communications. At 604, determine a first distance d1, where d1 is equal to lambda divided by two and lambda is the frequency of the test signal. In some embodiments, d1 may be determined based on a maximum frequency of the RF test signal of the DUT. At 606, form a test apparatus including an array of antenna elements, where an individual antenna element is spaced apart by at least d1 from an adjacent individual antenna element. At 608, place the test apparatus and the DUT in an RF shielded chamber with the antenna array of the DUT facing the array of antenna elements on the test apparatus at a distance d2, where d2 is within a near-field region. In some embodiments, d2 may be determined based on a maximum frequency of the RF test signal of the DUI. At 610, scan the array of antenna elements on the test apparatus using the electrical switches to receive the RF test signal transmitted by the DUT, and store the received test signal data in memory. At 612, convert the received near-field test signal data to far-field data and compare the far-field data to target data to determine whether the DUT passes or fails. In some embodiments, the near-field signal data may be converted to far-field signal data by applying FFT or spherical wave expansion methods.

Figure 7:
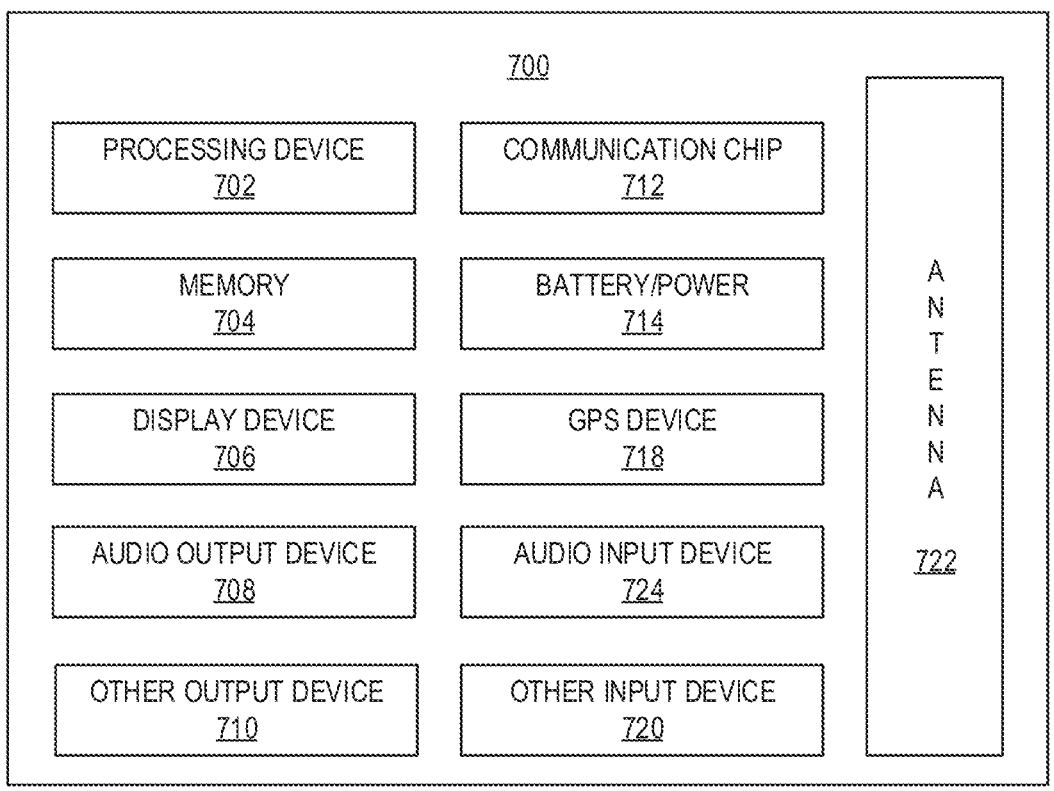
FIG. 7 is a block diagram of an example electrical device that may include a microelectronic assembly tested using an example test apparatus, in accordance with any of the embodiments disclosed herein.

FIG. 7 is a block diagram of an example electrical device 700 that may include wireless communications, or may include microelectronic assemblies with wireless communications, verified by the test apparatuses and methods disclosed herein. A number of components are illustrated in FIG. 7 as included in the electrical device 700, but any one or more of these components may be omitted or duplicated, as suitable for the application. In some embodiments, some or all of the components included in the electrical device 700 may be attached to one or more motherboards. In some embodiments, some or all of these components are fabricated onto a single system-on-a-chip (SoC) die.

Additionally, in various embodiments, the electrical device 700 may not include one or more of the components illustrated in FIG. 7, but the electrical device 700 may include interface circuitry for coupling to the one or more components. For example, the electrical device 700 may not include a display device 706, but may include display device interface circuitry (e.g., a connector and driver circuitry) to which a display device 706 may be coupled. In another set of examples, the electrical device 700 may not include an audio input device 724 or an audio output device 708, but may include audio input or output device interface circuitry (e.g., connectors and supporting circuitry) to which an audio input device 724 or audio output device 708 may be coupled.

The electrical device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 700 may include a memory 704, which may itself include one or more memory devices, such as volatile memory (e.g., dynamic random access memory (DRAM)), nonvolatile memory (e.g., read-only memory (ROM)), flash memory, solid-state memory, and/or a hard drive. In some embodiments, the memory 704 may include memory that shares a die with the processing device 702. This memory may be used as cache memory and may include embedded dynamic random access memory (eDRAM) or spin transfer torque magnetic random access memory (STT-MRAM).

In some embodiments, the electrical device 700 may include a communication chip 712 (e.g., one or more communication chips). For example, the communication chip 712 may be configured for managing wireless communications for the transfer of data to and from the electrical device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 712 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 712 may operate in accordance with a Global System for Mobile Communication (GSM), General Packet Radio Service (CPRS), Universal Mobile Telecommunications System (UMTS), High Speed Packet Access (HSPA), Evolved HSPA (E-HSPA), or LTE network. The communication chip 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, SG, and beyond. The communication chip 712 may operate in accordance with other wireless protocols in other embodiments. The electrical device 700 may include an antenna 722 to facilitate wireless communications and/or to receive other wireless communications (such as AM or FM radio transmissions).

In some embodiments, the communication chip 712 may manage wired communications, such as electrical, optical, or any other suitable communication protocols (e.g., the Ethernet). As noted above, the communication chip 712 may include multiple communication chips. For instance, a first communication chip 712 may be dedicated to shorter-range wireless communications such as Wi-Fi or Bluetooth, and a second communication chip 712 may be dedicated to longer-range wireless communications such as global positioning system (GPS), EDGE, CPRS, CDMA, WiMAX, LTE, EV-DO, or others. In some embodiments, a first communication chip 712 may be dedicated to wireless communications, and a second communication chip 712 may be dedicated to wired communications.

The electrical device 700 may include battery/power circuitry 714. The battery/power circuitry 714 may include one or more energy storage devices (e.g., batteries or capacitors) and/or circuitry for coupling components of the electrical device 700 to an energy source separate from the electrical device 700 (e.g., AC line power).

The electrical device 700 may include a display device 706 (or corresponding interface circuitry, as discussed above). The display device 706 may include any visual indicators, such as a heads-up display, a computer monitor, a projector, a touchscreen display, a liquid crystal display (LCD), a light-emitting diode display, or a flat panel display.

The electrical device 700 may include an audio output device 708 (or corresponding interface circuitry, as discussed above). The audio output device 708 may include any device that generates an audible indicator, such as speakers, headsets, or earbuds.

The electrical device 700 may include an audio input device 724 (or corresponding interface circuitry, as discussed above). The audio input device 724 may include any device that generates a signal representative of a sound, such as microphones, microphone arrays, or digital instruments (e.g., instruments having a musical instrument digital interface (MIDI) output).

The electrical device 700 may include a GPS device 718 (or corresponding interface circuitry, as discussed above). The GPS device 718 may be in communication with a satellite-based system and may receive a location of the electrical device 700, as known in the art.

The electrical device 700 may include another output device 710 (or corresponding interface circuitry, as discussed above). Examples of the other output device 710 may include an audio codec, a video codec, a printer, a wired or wireless transmitter for providing information to other devices, or an additional storage device.

The electrical device 700 may include another input device 720 (or corresponding interface circuitry, as discussed above). Examples of the other input device 720 may include an accelerometer, a gyroscope, a compass, an image capture device, a keyboard, a cursor control device such as a mouse, a stylus, a touchpad, a bar code reader, a Quick Response (OR) code reader, any sensor, or a radio frequency identification (RHD) reader.

The electrical device 700 may have any desired form factor, such as a hand-held/portable or mobile electrical device (e.g., a cell phone, a smart phone, a mobile internee device, a music player, a tablet computer, a laptop computer, a netbook computer, an ultrabook computer, a personal digital assistant (PDA), an ultra-mobile personal computer, etc.), a desktop electrical device, a server device or other networked computing component, a printer, a scanner, a monitor, a set-top box, an entertainment control unit, a vehicle. control unit, a digital camera, a digital video recorder, a wearable electrical device, or a wearable. computing device. In some embodiments, the electrical device 700 may be any other electronic device that processes data.

The following paragraphs provide various examples of the embodiments disclosed herein.

Example 1 is a wireless antenna testing device, the device including: a substrate having a first surface and an opposing second surface; an array of antenna elements at the first surface of the substrate, wherein a distance between an antenna element and an adjacent antenna element is at least half of a wavelength of a radio frequency (RF) test signal, and wherein a frequency of the RF test signal is between 1 GHz and 110 GHz; and an array of electrical switches, wherein an individual electrical switch is coupled to a respective individual antenna element.

Example 2 may include the subject matter of Example 1, and may further specify that the frequency of the RF test signal is 6 GHz, 20 GHz, 28 GHz, 60 GHz, or 90 GHz.

Example 3 may include the subject matter of Example 1, and may further specify that the antenna elements are receiving antennas.

Example 4 may include the subject matter of Example 3, and may further specify that the receiving antennas are to receive the RF test signal transmitted from a distance within a near-field region.

Example 5 may include the subject matter of Example 1, and may further specify that the individual electrical switches are to enable one or more respective individual antenna elements at a time.

Example 6 may include the subject matter of Example 1, and may further specify that the substrate is a printed circuit board, a package substrate, or a die.

Example 7 may include the subject matter of Example 1, and may further specify that the array of electrical switches is at the first surface of the substrate.

Example 8 may include the subject matter of Example 1, and may further specify that the array of electrical switches is at the second surface of the substrate.

Example 9 is a system for testing wireless devices, the system including: a radio frequency (RE) shielded chamber; a device under test (DUT) in the RF shielded chamber, wherein the DUT includes an array of first antenna elements; and a testing apparatus in the RF shielded chamber, the apparatus including: an array of second antenna elements at a first surface of a substrate to receive a radio frequency (RF) test signal from the DUT, wherein a distance between individual second antenna elements and an adjacent second antenna element is at least half of a wavelength of the RF test signal, wherein the array of first antenna elements faces the array of second antenna elements, and wherein a distance between the array of first antenna elements and the array of second antenna elements is within a near-field region; and an array of electrical switches, wherein an individual electrical switch is coupled to a respective individual second antenna element of the array of second antenna elements.

Example 10 may include the subject matter of Example 9, and may further specify that a frequency of the RF test signal is between 1 GHz and 110 GHz.

Example 11 may include the subject matter of Example 9, and may further specify that a frequency of the RF test signal is between 6 GHz and 90 GHz.

Example 12 may include the subject matter of Example 9, and may further specify that a frequency of the RF test signal is 6 GHz, 20 GHz, 28 GHz, 60 GHz or 90 GHz.

Example 13 may include the subject matter of Example 9, and may further specify that the distance between the array of first antenna elements and the array of second antenna elements is less than or equal to 250 millimeters.

Example 14 may include the subject matter of Example 9, and may further specify that the near-field region is between a minimum distance defined by $(0.62*(D3/lambda)½)$ and a maximum distance defined by $2*D2/lambda$, wherein is a diameter of the array of first antenna elements and lambda is the wavelength of the RF test signal.

Example 15 may include the subject matter of Example 9, and may further include: circuitry, coupled to the testing apparatus, to determine phase, frequency, power, or polarization of the test signal.

Example 16 may include the subject matter of Example 9, and may further specify that the array of first antenna elements and the array of second antenna elements include multiband antennas.

Example 17 is a method for testing wireless devices, the method including: transmitting, by an antenna array on a device under test (DUT) in a radio frequency (RF) shielded chamber, a test signal having a frequency; receiving, by an antenna array on a test apparatus, test signal data, wherein a distance between adjacent antenna elements in the antenna array is at least half of a wavelength of the test signal, wherein individual ones of the antenna elements are coupled to respective electrical switches, wherein individual antenna elements are activated by the respective electrical switches, and wherein a distance between the antenna array on the DUT and the antenna array on the test apparatus is within a near-field region; storing the received test signal data; and converting the received test signal data to far-field signal data.

Example 18 may include the subject matter of Example 17, and may further specify that a frequency of the test signal is between 1 GHz and 110 GHz.

Example 19 may include the subject matter of Example 17, and may further specify that the near-field region has a minimum distance defined by $(0.62*(D3/lambda)^{1/2})$ and a maximum distance defined by $2*D2/lambda$, wherein D is a diameter of the antenna array on the DUT and lambda is the wavelength of the test signal.

Example 20 may include the subject matter of Example 17, and may further specify that a frequency of the test signal is between 5 GHz and 90 GHz.

Example 21 may include the subject matter of Example 17, and may further specify that storing the received test signal data includes storing one or more of: phase, frequency, power, and polarization.

Example 22 may include the subject matter of Example 17, and may further include: comparing the far-field data to target data.

Example 23 is a system for testing wireless devices, the system including: a radio frequency (RF) shielded chamber; a device under test (DUT) in the RF shielded chamber, wherein the DUT includes an array of first antenna elements; and a testing apparatus in the RF shielded chamber, the apparatus including: an array of second antenna elements at a first surface of a substrate to receive a radio frequency (RF) test signal from the DUT, wherein a distance between individual second antenna elements and an adjacent second antenna element is at least half of a wavelength of a maximum RF test signal, wherein the array of first antenna elements face the array of second antenna elements, and wherein a distance between the array of first antenna elements and the array of second antenna elements is within a near-field region based on the maximum RF test signal; and an array of electrical switches, wherein an individual electrical switch is coupled to a respective individual second antenna element of the array of second antenna elements.

Example 24 may include the subject matter of Example 23, and may further specify that a frequency of the RF test signal is between 1 GHz and 110 GHz.

Example 25 may include the subject matter of Example 23, and may further specify that a frequency of the RF test signal is 1 GHz and a frequency of the maximum RF test signal is 2.4 GHz.

Example 26 may include the subject matter of Example 23, and may further specify that a RF frequency of the test signal is 20 GHz and a frequency of the maximum RF test signal is 28 GHz.

Example 27 may include the subject matter of Example 23, and may further specify that a total number of first antenna elements is equal to a total number of second antenna elements.

Example 28 may include the subject matter of Example 23, and may further include: circuitry, coupled to the testing apparatus, to determine phase, frequency, power, or polarization of the test signal.

Example 29 may include the subject matter of Example 23, and may further specify that the distance between the array of first antenna elements and the array of second antenna elements is less than 500 millimeters.

Example 30 may include the subject matter of Example 23, and may further specify that the near-field region is between a minimum distance defined by $(0.62*(D3/lambda)^{1/2})$ and a maximum distance defined by $2D2/lambda$, wherein D is a diameter of the array of first antenna elements and lambda is the wavelength of the maximum RF test signal.

The invention claimed is:

1. A wireless antenna testing device, the device comprising:
    a first wireless test apparatus comprising:
        a first substrate having a first surface and an opposing second surface;
        a first array of antenna elements at the first surface of the first substrate, wherein a distance between an antenna element and an adjacent antenna element is at least half of a wavelength of a radio frequency (RF) test signal, and wherein a frequency of the RF test signal is between 1 GHz and 110 GHz; and
        an array of electrical switches, wherein an individual electrical switch is coupled to a respective individual antenna element of the first array of antenna elements;
    a second wireless test apparatus comprising:
        second a substrate having a first surface and an opposing second surface;
        a second array of antenna elements at the first surface of the second substrate, wherein a distance between an antenna element and an adjacent antenna element is at least half of a wavelength of a radio frequency (RF) test signal, and wherein a frequency of the RF test signal is between 1 GHz and 110 GHz; and
        an array of electrical switches, wherein an individual electrical switch is coupled to a respective individual antenna element of the second array of antenna elements; and
    a support structure, wherein the first wireless test apparatus and the second wireless test apparatus are positioned within the wireless antenna testing device on opposite sides of the support structure and at different distances from the support structure.

2. The wireless antenna testing device of claim 1, wherein the frequency of the RF test signal is 6 GHz, 20 GHz, 28 GHz, 60 GHz, or 90 GHz.

3. The wireless antenna testing device of claim 1, wherein the antenna elements are receiving antennas.

4. The wireless antenna testing device of claim 3, wherein the receiving antennas are to receive the RF test signal transmitted from a distance within a near-field region.

5. The wireless antenna testing device of claim 1, wherein the individual electrical switches are to enable one or more respective individual antenna elements at a time.

6. The wireless antenna testing device of claim 1, wherein the array of electrical switches is at the first surface of the substrate.

7. The wireless antenna testing device of claim 1, wherein the array of electrical switches is at the second surface of the substrate.

8. A system for testing wireless devices, the system comprising:
    a radio frequency (RF) shielded chamber;
    a device under test (DUT) in the RF shielded chamber, wherein the DUT includes an array of first antenna elements and an array of fourth antenna elements, wherein the first and fourth arrays are on opposite sides of the DUT;
    a first testing apparatus in the RF shielded chamber, the first testing apparatus comprising:
        an array of second antenna elements at a first surface of a substrate to receive a radio frequency (RF) test signal from the DUT, wherein a distance between individual second antenna elements and an adjacent second antenna element is at least half of a wavelength of the RF test signal, wherein the array of first antenna elements faces the array of second antenna elements, and wherein a distance between the array of first antenna elements and the array of second antenna elements is within a near-field region; and an array of electrical switches, wherein an individual electrical switch is coupled to a respective individual second antenna element of the array of second antenna elements;

a second testing apparatus in the RF shielded chamber, the second testing apparatus comprising:

an array of third antenna elements at a first surface of a substrate to receive a radio frequency (RF) test signal from the DUT, wherein a distance between individual third antenna elements and an adjacent third antenna element is at least half of a wavelength of the RF test signal, wherein the array of fourth antenna elements faces the array of third antenna elements, and wherein a distance between the array of third antenna elements and the array of fourth antenna elements is within a near-field region; and an array of electrical switches, wherein an individual electrical switch is coupled to a respective individual third antenna element of the array of third antenna elements;

wherein the first and second testing apparatuses are on opposite sides of the DUT in the RF shielded chamber at different distances from the DUT.

9. The system of claim 8, wherein a frequency of the RF test signal is between 1 GHz and 110 GHz.

10. The system of claim 8, wherein a frequency of the RF test signal is between 6 GHz and 90 GHz.

11. The system of claim 8, wherein the distance between the array of first antenna elements and the array of second antenna elements is less than or equal to 250 millimeters.

12. The system of claim 8, wherein the near-field region is between a minimum distance defined by $(0.62*(D^3/lambda)^{1/2})$ and a maximum distance defined by $2*D^2/lambda$, wherein D is a diameter of the array of first antenna elements and lambda is the wavelength of the RF test signal.

13. The system of claim 8, further comprising:
circuitry, coupled to the testing apparatus, to determine phase, frequency, power, or polarization of the test signal.

14. The system of claim 8, wherein the array of first antenna elements and the array of second antenna elements include multiband antennas.

15. A system for testing wireless devices, the system comprising:

a radio frequency (RF) shielded chamber;

a device under test (DUT) in the RF shielded chamber, wherein the DUT includes an array of first antenna elements and an array of fourth antenna elements, wherein the first and fourth arrays are on opposite sides of the DUT; and a first testing apparatus in the RF shielded chamber, the first testing apparatus comprising:

an array of second antenna elements at a first surface of a substrate to receive a radio frequency (RF) test signal from the DUT, wherein a distance between individual second antenna elements and an adjacent second antenna element is at least half of a wavelength of a maximum RF test signal, wherein the array of first antenna elements face the array of second antenna elements, and wherein a distance between the array of first antenna elements and the array of second antenna elements is within a near-field region based on the maximum RF test signal; and an array of electrical switches, wherein an individual electrical switch is coupled to a respective individual second antenna element of the array of second antenna elements a second testing apparatus in the RF shielded chamber, the second testing apparatus comprising:

an array of third antenna elements at a first surface of a substrate to receive a radio frequency (RF) test signal from the DUT, wherein a distance between individual third antenna elements and an adjacent third antenna element is at least half of a wavelength of the RF test signal, wherein the array of fourth antenna elements faces the array of third antenna elements, and wherein a distance between the array of third antenna elements and the array of fourth antenna elements is within a near-field region; and an array of electrical switches, wherein an individual electrical switch is coupled to a respective individual third antenna element of the array of third antenna elements;

wherein the first and second testing apparatuses are on opposite sides of the DUT in the RF shielded chamber at different distances from the DUT.

16. The system of claim 15, wherein a frequency of the RF test signal is between 1 GHz and 110 GHz.

17. The system of claim 15, wherein a frequency of the RF test signal is 1 GHz and a frequency of the maximum RF test signal is 2.4 GHz.

18. The system of claim 15, wherein a RF frequency of the test signal is 20 GHz and a frequency of the maximum RF test signal is 28 GHz.

19. The system of claim 15, further comprising:
circuitry, coupled to the testing apparatus, to determine phase, frequency, power, or polarization of the RF test signal.

20. The system of claim 15, wherein the near-field region is between a minimum distance defined by $(0.62*(D^3/lambda)^{1/2})$ and a maximum distance defined by $2*D^2/lambda$, wherein D is a diameter of the array of first antenna elements and lambda is the wavelength of the maximum RF test signal.

* * * * *

UNITED STATES PATENT AND TRADEMARK OFFICE
CERTIFICATE OF CORRECTION

PATENT NO. : 11,671,144 B2
APPLICATION NO. : 16/367743
DATED : June 6, 2023
INVENTOR(S) : Mustapha Amadu Abdulai et al.

It is certified that error appears in the above-identified patent and that said Letters Patent is hereby corrected as shown below:

In the Claims

In Column 16, Claim 1, Line 21, delete "second a substrate" and insert -- a second substrate --, therefor.

In Column 16, Claim 1, Line 27, delete "a frequency" and insert -- the frequency --, therefor.

Signed and Sealed this
First Day of August, 2023

Katherine Kelly Vidal
*Director of the United States Patent and Trademark Office*